United States Patent [19]
Tuttle et al.

[11] Patent Number: 5,973,263
[45] Date of Patent: Oct. 26, 1999

[54] ENCAPSULATED ELECTRONIC COMPONENT AND METHOD FOR ENCAPSULATING AN ELECTRONIC COMPONENT

[75] Inventors: Mark E. Tuttle; Joseph P. Mousseau; Clay L. Cirino, all of Boise, Id.

[73] Assignee: Micron Communications, Inc., Boise, Id.

[21] Appl. No.: 08/914,308

[22] Filed: Aug. 18, 1997

Related U.S. Application Data

[63] Continuation of application No. 08/598,461, Feb. 8, 1996, Pat. No. 5,700,981.

[51] Int. Cl.⁶ .................................................. H01L 23/28
[52] U.S. Cl. ............................................ 174/52.2; 257/790
[58] Field of Search .................................... 174/250, 255, 174/256, 258, 260, 52.2, 52.3, 52.4; 361/760, 761, 762, 764, 765, 812; 29/855, 856, 841, 885; 257/782, 783, 784, 787, 790

[56] References Cited

U.S. PATENT DOCUMENTS

| | | | |
|---|---|---|---|
| 4,075,632 | 2/1978 | Baldwin et al. | 342/51 |
| 4,122,211 | 10/1978 | Kikuga et al. | 427/27 |
| 4,926,182 | 5/1990 | Ohta et al. | 342/44 |
| 5,422,514 | 6/1995 | Griswold et al. | 257/679 |
| 5,528,457 | 6/1996 | Hawke et al. | 361/706 |
| 5,547,730 | 8/1996 | Weiblen et al. | 428/76 |
| 5,600,181 | 2/1997 | Scott et al. | 257/723 |
| 5,621,412 | 4/1997 | Sharpe et al. | 342/51 |
| 5,649,296 | 7/1997 | MacLellan et al. | 455/38.2 |

OTHER PUBLICATIONS

IBM Technical Disclosures, vol. 11, No. 8, Cameron and Finch, p. 971, Jan. 1969.

Primary Examiner—Hyung-Sub Sough
Assistant Examiner—Hung V Ngo
Attorney, Agent, or Firm—Wells, St. John, Roberts, Gregory & Matkin P.S.

[57] ABSTRACT

An encapsulation body for enclosing an electronic element is disclosed and which includes a first layer of a slow curing two-part epoxy which is in a flowable state; a second layer of material positioned outwardly of the first layer and which substantially retains the first layer of material on the electronic element while the first layer of material is in a flowable state; and a dam surrounding the electronic element, the first and second layers of material received within the dam.

6 Claims, 3 Drawing Sheets

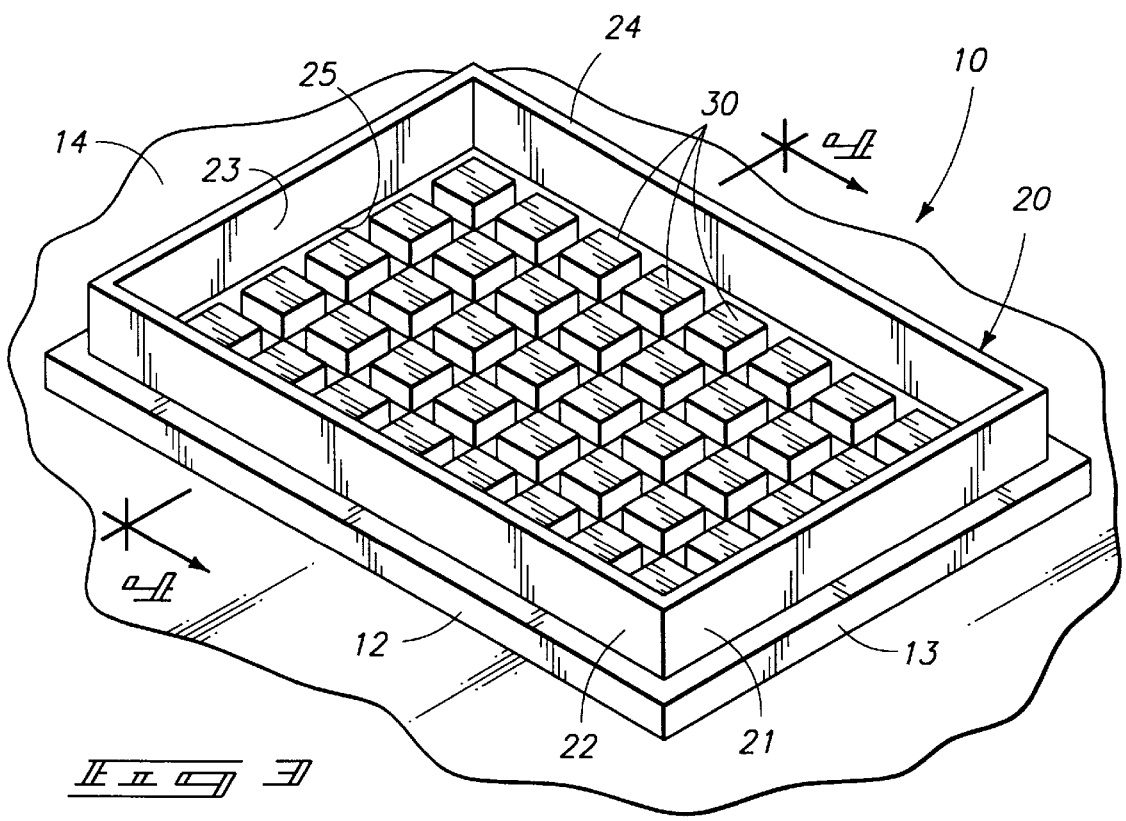
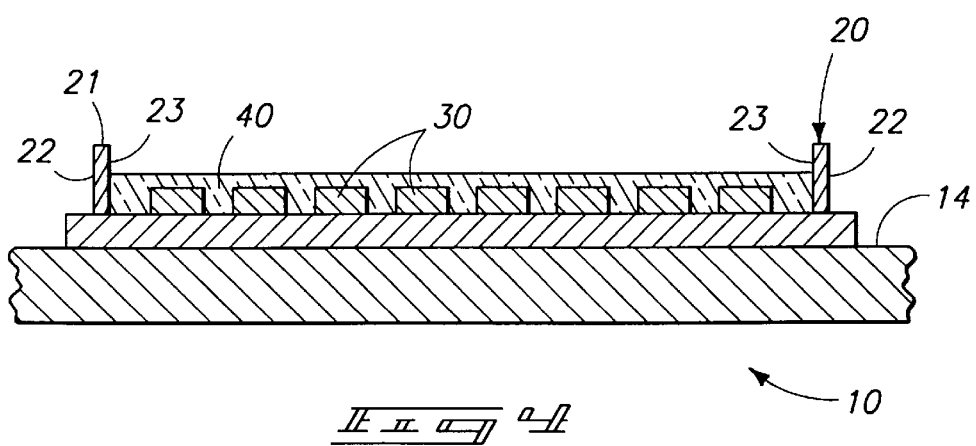

ENCAPSULATED ELECTRONIC COMPONENT AND METHOD FOR ENCAPSULATING AN ELECTRONIC COMPONENT

This is a continuation application which claims priority from application Ser. No. 08/598,461, filed Feb. 8, 1996, now U.S. Pat. No. 5,700,981.

TECHNICAL FIELD

This invention relates to the formation of an encapsulated electronic component and a method for encapsulating an electronic component.

BACKGROUND OF THE INVENTION

In wafer fabrication, the wafers pass many times in and out of four basic operations. Such are layering, patterning, doping, and heat processing. In final packaging of dies cut from wafers, there are also several basic operations. As in fabrication, the exact order of the operation is determined by the package type and other factors. However, in packaging the flow is linear, with the semiconductor dies proceeding from one operation to the next, only going through the individual packaging operations once. As a general matter, the packaging operations for semiconductor devices include backside preparation, die separation, die pick, inspection, die attach, wire bonding, pre-seal inspection, package sealing, plating, trim, marking, and final test.

There are four basic functions performed by a semiconductor package. They are to provide a lead system, physical protection, environmental protection, and heat dissipation. In this regard, the primary function of the package is to allow connection of the chip or semiconductor device to a circuit board or directly to an electronic product. The second function of the package is the physical protection of the semiconductor device from breakage, contamination and abuse. Physical protection needs vary from low, as in the case of consumer products, to very stringent, as is the case for electronic circuits used in automobiles, space vehicles, and military applications. Environmental protection, on the other hand, for semiconductor devices is to protect the semiconductor device from chemicals, moisture and gases that may interfere with its functioning. Still further, every semiconductor device generates heat during operation. The package enclosure materials used with semiconductor devices serve in nearly all instances, to draw the heat away from the enclosed semiconductor devices thereby dissipating same.

One method of providing an enclosure includes the use of a two part epoxy system. Such is typically very slow to cure, with the epoxy remaining in a flowable state while it cures. Curing times for such epoxy materials may take 24 hours or more. Due in part to the flowable nature of the epoxy, such packaging requires that the semiconductor devices be maintained in a precisely level state for a significant period of time as the epoxy cures. This requirement, of course, reduces the throughput of this packaging method and is therefore very costly, and not conducive to high volume production.

A novel packaging method which addresses the shortcomings identified above, is the subject of the present invention.

BRIEF DESCRIPTION OF THE DRAWINGS

FIG. 3 is a perspective view of a processing step subsequent to that shown by FIG. 2.

FIG. 4 is a transverse, vertical, sectional view taken from a position along line 4—4 of FIG. 3, and at a processing step subsequent to that shown in FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the present invention, a method of encapsulating an electronic component includes the following steps:

providing a substrate;

providing an enclosure dam around at least a portion of an electronic component placed relative to the substrate;

providing a first substantially uncured flowable encapsulation material outwardly of the electronic component and within the enclosure dam;

providing a second encapsulation material atop the first encapsulation material and within the enclosure dam; and curing the first encapsulation material into a substantially non-flowable state, the second encapsulation material and enclosure dam retaining the first flowable encapsulation material relative to the electronic component and substrate during the curing, the cured first material and the second material collectively forming a resultant encapsulation body on the electronic component.

Another aspect of the present invention is to provide a method for encapsulating an electronic component which includes the following steps:

providing an enclosure dam around at least a portion of the electronic component, the electronic component supported relative to a substrate;

providing a first, flowable two part epoxy atop the electronic component and within the enclosure dam the first flowable two part epoxy being curable to a non-flowable state; and providing a second two part epoxy atop the first two part epoxy and within the enclosure dam, the second two part epoxy and the enclosure dam retaining the first flowable two part epoxy relative to the electronic component and substrate during the curing of the first two part epoxy, the cured first two part epoxy and the second two part epoxy collectively forming a resulting encapsulation body on the electronic component.

Still another aspect of the present invention relates to a composite encapsulation body for enclosing an electronic element relative to a substrate and which includes:

a first layer of material positioned in covering relation relative to the electronic element; the first layer having an uncured flowable state, and a cured non-flowable state; and a second layer of material positioned in covering relation relative to the first layer, the second layer facilitating retention of the first layer on the electronic element while the first layer remains in the uncured, flowable state.

Figure 1:
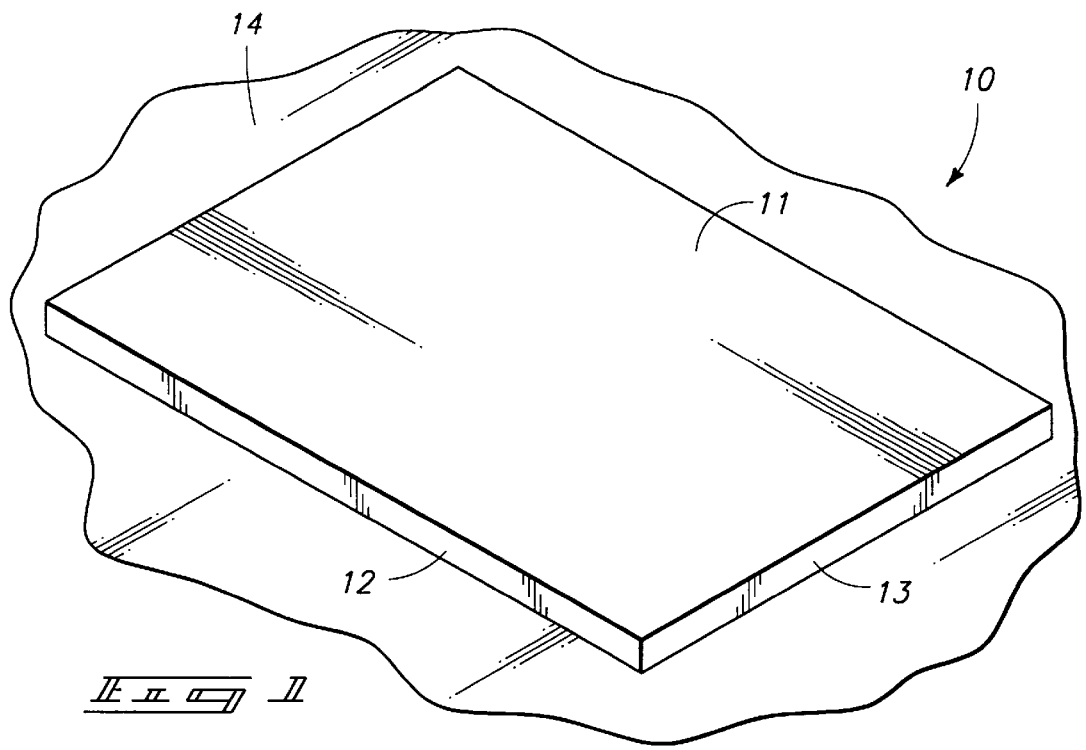
FIG. 1 is a perspective view of one processing step in accordance with the present invention.

Referring now to FIG. 1, a rigid substrate 10 is provided and which has a substantially level top or upwardly facing surface 11 and a downwardly facing surface 12. The substrate 10 is further defined by a peripheral edge 13. The downwardly facing surface 12 is supported on a fixturing table 14. The fixturing table 14 is very flat (within three mils) over the entire surface area thereof and substantially level.

Figure 2:
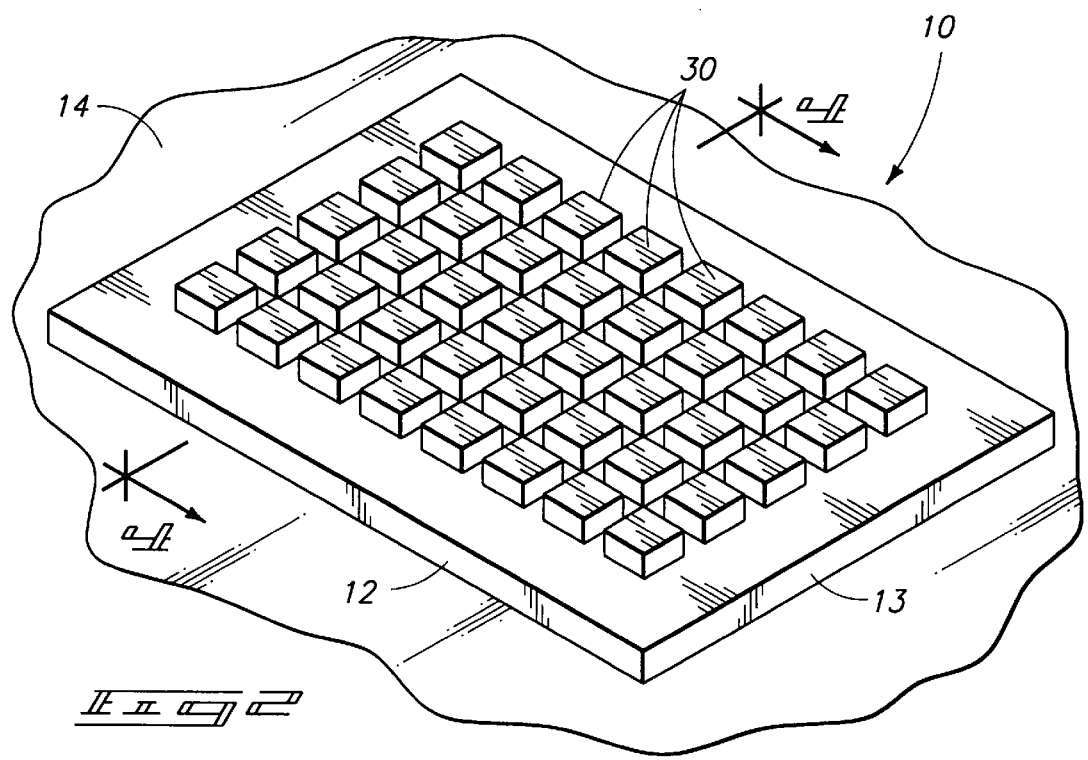
FIG. 2 is a perspective view of a processing step subsequent to that shown by FIG. 1.

As seen in FIG. 2, a plurality of electronic components 30 are placed in rested relation relative to the substrate 10. The individual electronic components are adhesively secured on the upwardly facing surface 11. The electronic components may be all manner of integrated circuitry components, such as dies or dies made integral with an associated printed circuit board. In the alternative, the dies or electronic components 30 may be placed in rested relation on the substrate 10 and, the dam 20 then laced around the electronic components.

FIG. 3 shows the method for encapsulating an electronic component at a step subsequent to that shown in FIG. 1. In FIG. 3, an enclosure dam 20 is shown atop the substrate 10, and in rested relation on the upwardly facing surface 11 thereof. The dam 20 may operate as a permanent or sacrificial (mechanical) structure. The dam 20 has a substantially continuous side wall 21 which is defined by an exterior facing surface 22, an interior facing surface 23, a top edge 24, and a bottom edge 25 which rests in juxtaposed relation on the upwardly facing surface 11. The continuous side wall 21 has a given height dimension, with an example being about 250 mils. In addition, it should be understood that while the dam 20 is shown as surrounding or encircling all of the electronic components 30, a dam 20 may be provided which surrounds only a portion of the electronic components 30. As noted above, the enclosure dam 20 has a given height dimension; and as seen in FIG. 3, this height dimension is greater than the height dimension of the individual electronic components 30.

In FIG. 4, a first substantially uncured flowable encapsulation material 40 is provided outwardly of the electronic components 30, and within the enclosure dam 20. The first encapsulation material 40 comprises a slow curing high strength, and low shrinkage polymeric based material such as a thermosetting resin in the nature of a two part epoxy system. Two part epoxy resins are thermosetting resins based on the reactivity of the epoxide group. One type of epoxy is made from the reaction of epichlorohydrin and bisphenol A in the formulation of these types of epoxy. Aliphatic polyols such as glycerol may be used instead of the aromatic bisphenol A. Molecules of this type typically have glycidyl ether structures in the terminal positions, and further have many hydroxyl groups. These epoxies cure readily when exposed to amines.

Another type of epoxy resin is made from the reaction of polyolefins oxidized with peracetic acid. These substances have more epoxide groups, within the molecule as well as in the terminal positions and can be cured with anhydrides. Curing requires higher temperatures, however. Many modifications of both types are made commercially. As a general matter, the reactive epoxies form a tight cross-linked polymer network and are characterized by toughness, good adhesion, corrosive—chemical resistance, and good dielectric properties. Still further and as noted above, most epoxy resins are of the two-part type which harden or otherwise cure when blended. A two part epoxy material may be purchased from Epic Resins of Palmyra, Wis.

Figure 5:
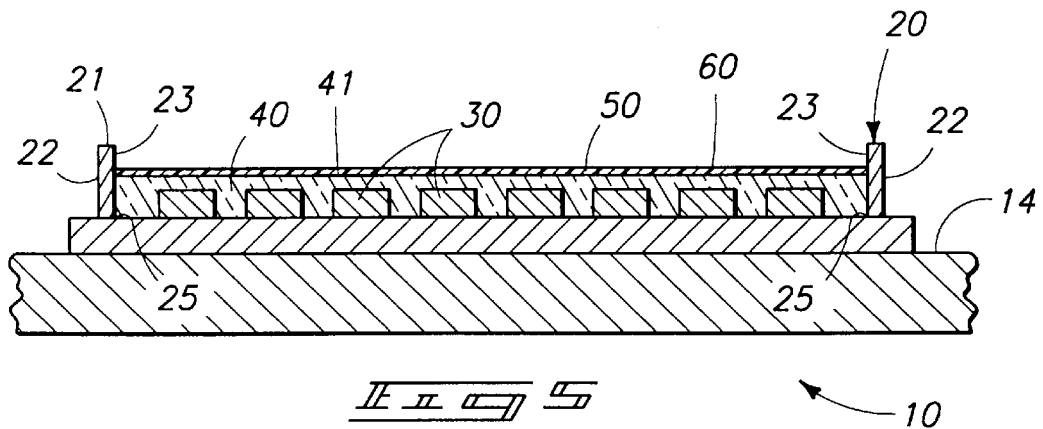
FIG. 5 is a transverse, vertical, sectional view taken from a position along line 4—4 of FIG. 3, and at a processing step subsequent to that shown in FIG. 4.

Referring now to FIG. 5, a second encapsulation material 50 is provided atop the first encapsulation material 40, and within the enclosure dam 20. The second encapsulation material 50 comprises a composition which, on occasion, is similar in chemistry to that of the first encapsulation material 40, but which has a given curing rate which is faster, relatively speaking, than the curing rate of the first encapsulation material 40. This second layer of encapsulating material 50, once substantially cured, effectively functions to hold or maintain the underlying slow curing first encapsulation material 40 relative to the electronic component 30 which is being coated. Once the second encapsulation material substantially cures, the substrate 10 can be moved from the fixturing table 14 to an environment that is not perfectly flat and level. This increases the throughput for production of such encapsulated electronic components 30 because the fixturing tables 14 are then made available for other devices to be packaged.

Figure 6:
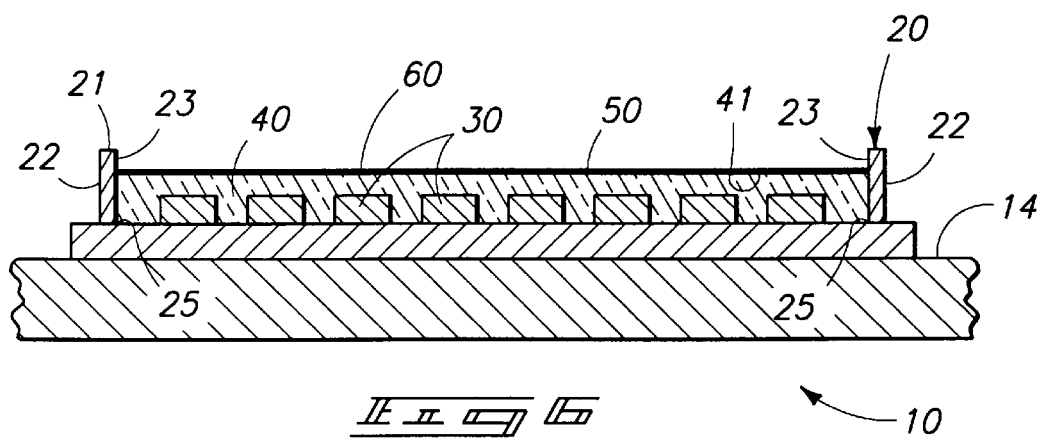
FIG. 6 is a transverse, vertical, sectional view taken from a position along line 4—4 of FIG. 3 and at an alternative processing step subsequent to that shown in FIG. 4.
Figure 7:
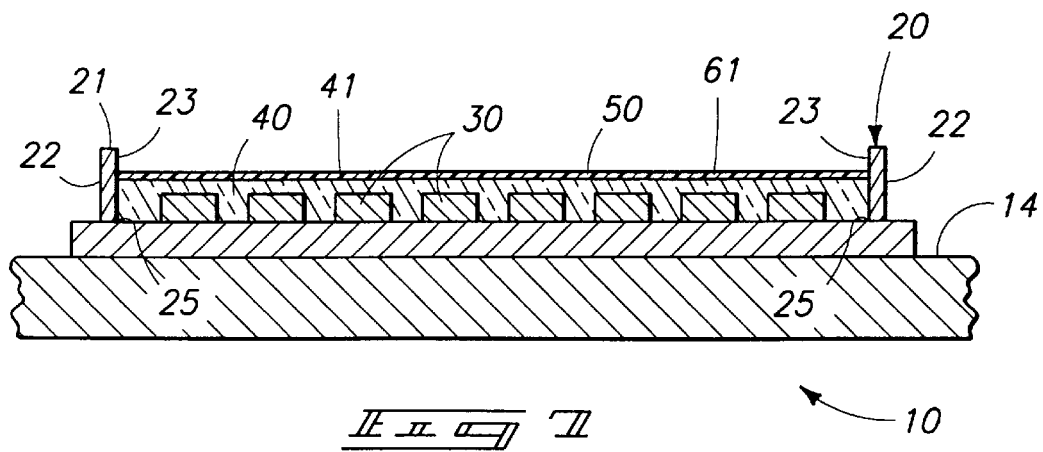
FIG. 7 is a transverse, vertical, sectional view taken from a position along 4—4 of FIG. 3 and at a processing step subsequent to that shown in FIG. 6.

An alternate form of the present invention is shown in FIG. 6. In the alternate form, electronic components 30 are provided atop the substrate 10, and a first encapsulation material 40 is provided atop the electronic components and within the dam 20. A catalyst 60 is then provided atop the exterior facing surface 41 of the first encapsulating material 10. The catalyst 60 effectively reacts, and becomes intermixed with the exterior facing surface 41. The catalyst 60 is effective in hardening or otherwise accelerating the curing rate of the exterior facing surface 41 to provide a shell 61 which operates as the second encapsulation material. The first encapsulation material 40 will cure into a hardened, non-flowable state following the passage of approximately 24 to 48 hours.

In still another alternative form of the invention, the second encapsulation material 50 of the first described embodiment may include a light curable coating which cures when exposed to certain radiation, such as ultraviolet radiation. In this particular form of the invention, the step of curing comprises exposing the light curable coating to ultraviolet radiation to cure the coating thereby providing the means for maintaining the first encapsulation material 40 contained over the individual electronic components 30. In all forms of the invention the dam 20 may, on the one hand, following curing, be removed, or on the other hand, become integral with the electronic components 30 being packaged. The method of the present invention provides a composite encapsulation body for enclosing the electronic component in a fashion not possible heretofore.

In compliance with the statute, the invention has been described in language more or less specific as to structural and methodical features. It is to be understood, however, that the invention is not limited to the specific features described since the means herein disclosed comprise preferred forms of putting the invention into effect. The invention is, therefore, claimed in any of its forms or modifications within the proper scope of the appended claims appropriately interpreted in accordance with the Doctrine of Equivalents.

We claim:

1. An encapsulation body for enclosing an electronic element which rests on a substrate, comprising:

a first layer of material positioned in covering relation relative to the electronic component, the first layer of material comprising a slow curing two part epoxy which is in a flowable state;

a second layer of material positioned outwardly of the first layer of material and which substantially retains the first layer of material on the electronic element while the first layer of material is in the flowable state; and a dam surrounding the electronic element, the first and second layers of material received within the dam.

2. An encapsulation body for enclosing an electronic element which rests on a substrate, comprising:

a first layer of material positioned in covering relation relative to the electronic component, the first layer of material comprising a slow curing two part epoxy which is in a flowable state, and wherein the first layer two part epoxy has an exterior surface;

a second layer of material positioned outwardly of the first layer of material and which substantially retains the first layer of material on the electronic element while the first layer of material is in the flowable state, and wherein the second layer comprises a material which accelerates the hardening of the exterior surface of the first layer two part epoxy; and a dam surrounding the electronic element, the first and second layers of material received within the dam.

3. An encapsulation body as claimed in claim 2 wherein the second layer of material comprises a catalyst which accelerates hardening and a fast curing two part epoxy.

4. An encapsulation body as claimed in claim 2, wherein the second layer of material comprises a catalyst, and a light curable coating.

5. A method for encapsulating an electronic component which is supported on a substrate, comprising:

providing a first flowable two part epoxy layer on the electronic component, the first flowable two part epoxy layer having a first curing rate;

providing a second two part epoxy layer atop the first two part epoxy layer, the second two part epoxy layer having a second curing rate which is faster than the first curing rate, the second two part epoxy layer retaining the first flowable two part epoxy layer on the electronic component while the first flowable two part epoxy layer cures; and providing an enclosure dam around the electronic component, the first flowable layer and second layer received within the dam.

6. A method as claimed in claim 5, wherein the first flowable two part epoxy layer has an exterior surface, and wherein a catalyst is applied to the exterior surface of the first flowable two part epoxy layer.

* * * * *